(12) United States Patent
Feist et al.

(10) Patent No.: US 7,081,841 B1
(45) Date of Patent: Jul. 25, 2006

(54) ANALOG TO DIGITAL CONVERTER BUILT IN SELF TEST

(75) Inventors: Douglas J. Feist, Fort Collins, CO (US); Scott C. Savage, Ft. Collins, CO (US); Kevin J. Gearhardt, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/117,682

(22) Filed: Apr. 28, 2005

(51) Int. Cl.
*H03M 1/20* (2006.01)

(52) U.S. Cl. .................. 341/120; 341/144; 341/155

(58) Field of Classification Search .............. 341/120, 341/144, 155
See application file for complete search history.

(56) References Cited

U.S. PATENT DOCUMENTS

| | | | |
|---|---|---|---|
| 4,419,656 A * | 12/1983 | Sloane | 341/120 |
| 4,875,048 A * | 10/1989 | Shimizu et al. | 341/156 |
| 5,132,685 A * | 7/1992 | DeWitt et al. | 341/120 |
| 5,185,607 A * | 2/1993 | Lyon et al. | 341/120 |
| 5,659,312 A * | 8/1997 | Sunter et al. | 341/120 |
| 5,854,598 A * | 12/1998 | De Vries et al. | 341/120 |
| 6,211,803 B1 * | 4/2001 | Sunter | 341/120 |
| 6,333,706 B1 * | 12/2001 | Cummings et al. | 341/120 |
| 6,456,102 B1 * | 9/2002 | Mori et al. | 324/765 |
| 6,557,131 B1 * | 4/2003 | Arabi | 714/734 |
| 6,987,472 B1 * | 1/2006 | Lin | 341/120 |

OTHER PUBLICATIONS

Naylor, "Testing DACs and ADCs"; IEEE Trans. Circuits and SYstems, vol. Cas-25, No. 7, Jul. 1978, pp. 526-538.*
Arabi et al., "A New Built-in Self-Test Approach for DAC and ADCs", IEEE/ACM Int'l Conf. on CAD-94, Digest of Technical Papers, IEEE Conputer Society Press, 1994 (no month) pp. 491-494.*

* cited by examiner

*Primary Examiner*—Jean Bruner Jeanglaude
(74) *Attorney, Agent, or Firm*—Luedeka, Neely & Graham PC

(57) ABSTRACT

A built in self test circuit for testing an analog to digital converter. An up counter receives a test input and a first clock signal and provides and upper limit. A down counter receives the test input and the first clock signal, and provides a lower limit. A digital to analog converter receives the test input and a second clock signal, and provides an analog output. Circuitry provides the analog output and a third clock signal to the analog to digital converter, and the analog to digital converter thereby produces a digital signal. An upper limit comparator receives the upper limit and the digital signal, and provides an upper limit status signal indicating whether the digital signal violates the upper limit. A lower limit comparator receives the lower limit and the digital signal, and provides a lower limit status signal indicating whether the digital signal violates the lower limit.

3 Claims, 2 Drawing Sheets

ANALOG TO DIGITAL CONVERTER BUILT IN SELF TEST

FIELD

This invention relates to the field of integrated circuit fabrication. More particularly, this invention relates to testing analog to digital converters.

BACKGROUND

Analog to digital converters tend to have very lengthy test development cycle times, highly specific tester platform requirements, and require external board components for testing. One current problem with test development for analog to digital converters is that each test must be manually generated, which typically requires several weeks or longer. In addition, current analog to digital converter testing requires an analog test platform, which typically limits the available tester platform resources. However, testing of analog to digital converters, such as at wafer sort, tends to be a highly important process, which tends to prevent faulty analog to digital converter circuitry from reaching package assembly.

What is needed, therefore, is a system that overcomes problems such as those described above, at least in part.

SUMMARY

The above and other needs are met by a built in self test circuit for testing an analog to digital converter. An up counter receives a test input and a first clock signal and provides and upper limit. A down counter receives the test input and the first clock signal, and provides a lower limit. A digital to analog converter receives the test input and a second clock signal, and provides an analog output. Circuitry provides the analog output and a third clock signal to the analog to digital converter, and the analog to digital converter thereby produces a digital signal. An upper limit comparator receives the upper limit and the digital signal, and provides an upper limit status signal indicating whether the digital signal violates the upper limit. A lower limit comparator receives the lower limit and the digital signal, and provides a lower limit status signal indicating whether the digital signal violates the lower limit.

In this manner, the built in self test circuit can reside on the same monolithic chip as the analog to digital converter to be tested, and can test the analog to digital converter with simple inputs that can be generated by any digital testers. Thus, specialized testing equipment or other additional external equipment is not necessary in order to test the digital to analog converters.

A nor gate preferably receives the upper limit status signal and the lower limit status signal, and provides one of a logical high as a pass indication of the analog to digital converter when the digital signal violates neither the upper limit nor the lower limit, and a logical low as a fail indication of the analog to digital converter when the digital signal violates at least one of the upper limit and the lower limit.

Also described is a built in self test circuit for testing digital to analog converter. An up counter receives a test input and a first clock signal and provides and upper limit. A down counter receives the test input and the first clock signal and provides a lower limit. Circuitry provides the test input and a third clock signal to the digital to analog converter, and the digital to analog converter thereby produces an analog signal. An analog to digital converter receives the analog signal and a second clock signal, and provides a digital signal. An upper limit comparator receives the upper limit and the digital signal and provides an upper limit status signal, indicating whether the digital signal violates the upper limit. A lower limit comparator receives the lower limit and the digital signal, and provides a lower limit status signal indicating whether the digital signal violates the lower limit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
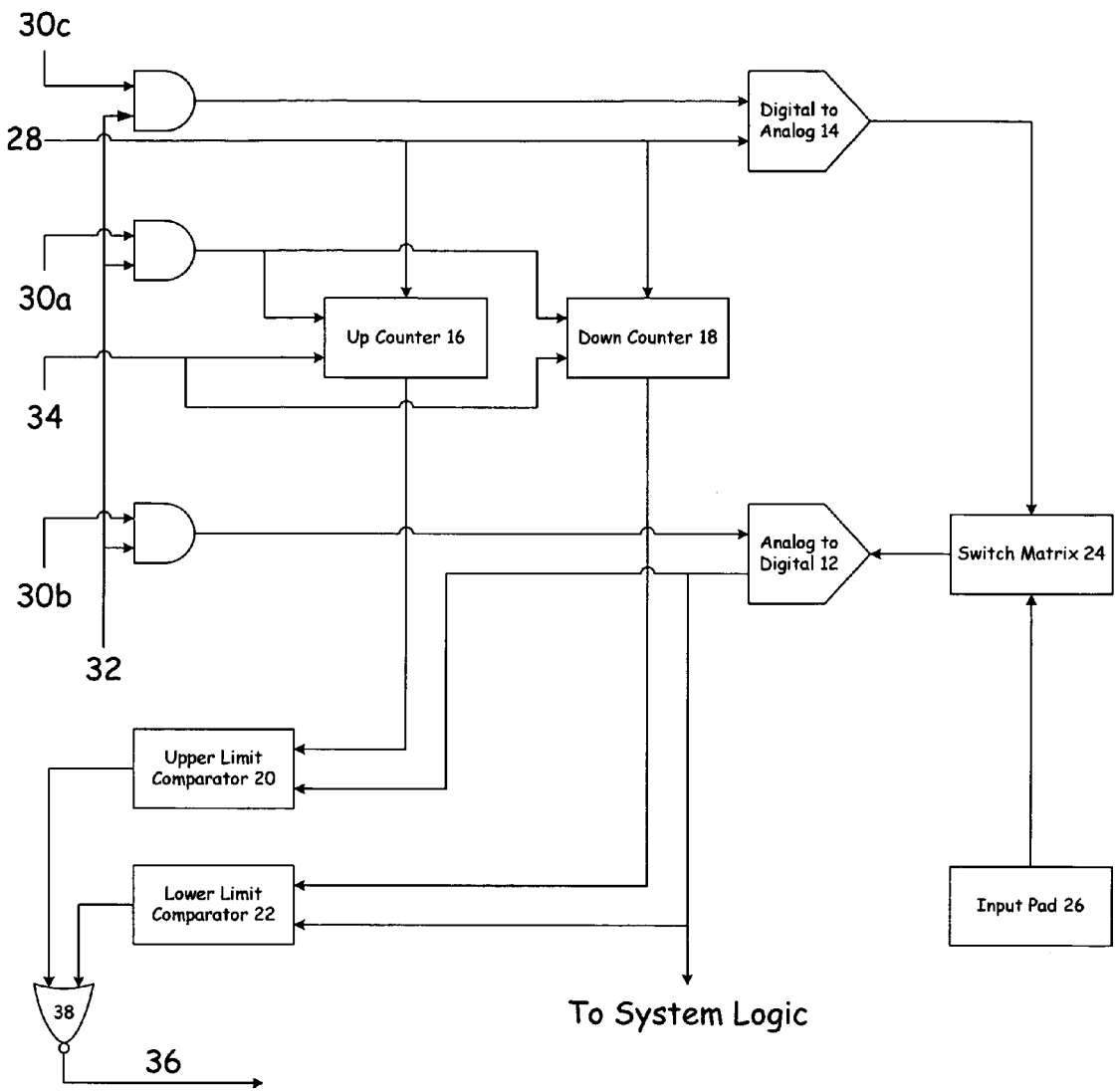
FIG. 1 is a functional block diagram of a built in self test circuit according to a preferred embodiment of the invention.

The various embodiments of the present invention relate generally to the implementation of built in self test circuitry 10 for testing an N-bit analog to digital converter 12. The test circuitry 10 surrounding the analog to digital converter 12 preferably consists of an N-bit digital to analog converter 14, one N-bit up counter 16, one N-bit down counter 18, and two N-bit magnitude bus comparators 20 and 22. Additional circuitry preferably includes an analog switching network 24 to connect either the external pad 26 (normal mode) or the output of the digital to analog converter 14 test output (test mode) to the input of the analog to digital converter 12. Some combinational logic is also preferably included to gate control and clock signals to the counters and converters, and to create the pass/fail bit from the magnitude comparator outputs. The digital interface to the built in self test block preferably consists of the N-bit test bus 28 to drive the digital to analog converter 14, and control signals 30a, 30b, and 30c for gating clock signals 32 to the up/down counters 16 and 18, digital to analog converter 14, and analog to digital converter 12. The lone output bit 36 from the interface is preferably the pass/fail status bit.

The test operation preferably consists of driving an N-bit value 28 at the built in self test interface to the digital to analog converter 14. The digital to analog converter 14 converts the digital bus value to the equivalent analog voltage, which in turn drives the input of the analog to digital converter 12 under test. At the same time, the N-bit value 28 at the digital to analog converter is pre-loaded into both the up and down counters 16 and 18 using the LOAD signal 34. Control logic 30a feeds additional clock signals 32 to the up/down counters 16 and 18 to increment/decrement the N-bit value, to form upper and lower limits from which the output of the analog to digital converter 12 can be compared. The additional clocks 32 fed into the up/down counters 16 and 18 allow the user to set limits around the N-bit value in one bit increments. To obtain a test limit of +/− two bits around the N-bit input value, the CNT_EN control signal 30a is preferably held high for two clock cycles, allowing the up/down counters 16 and 18 to increment/decrement two counts from the loaded N-bit value 34.

Figure 2:
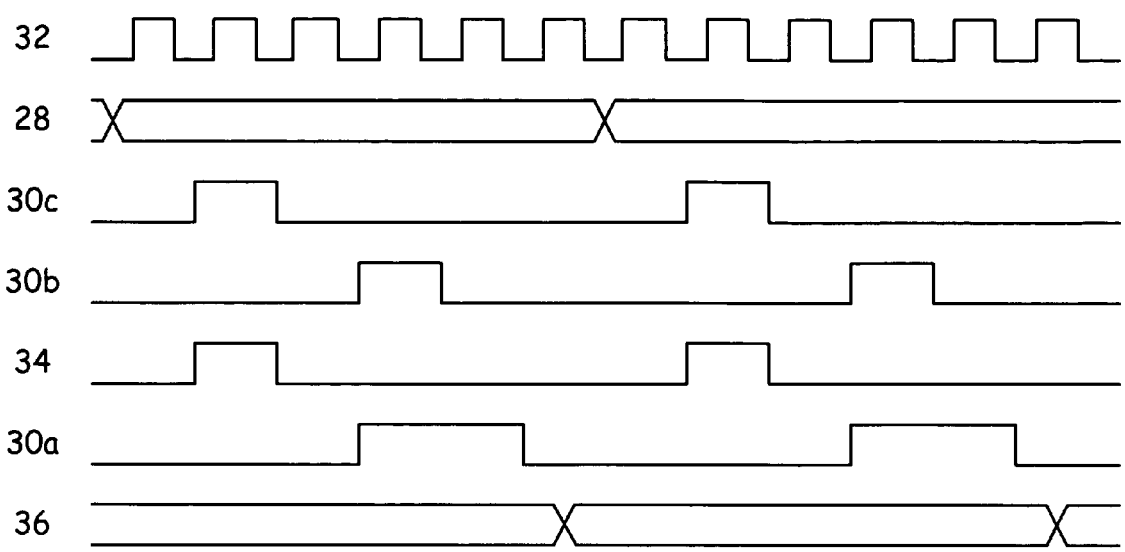
FIG. 2 is a circuit timing diagram for two full cycles of built in self test circuit of FIG. 1 according to a preferred embodiment of the invention.

One preferably limitation on the up/down counters 16 and 18 is that they cannot overflow/underflow so the max/min limit is all 1's and all 0's respectively. The analog to digital converter 12 output, along with the upper limit as set by the up counter 16, is loaded into the upper limit N-bit magnitude comparator 20. Likewise, the analog to digital converter 12 output along with the lower limit, as set by the down counter 18, is loaded into the lower limit N-bit magnitude comparator 22. The magnitude comparators 20 and 22 compare bit-by-bit, starting with the most significant bit, the output of the analog to digital converter 12 and the respective limit from 16 and 18. The upper limit magnitude comparator 20 outputs a logical high if the analog to digital converter 12 output is larger than the upper limit, while the lower limit magnitude comparator 22 outputs a logical high if the analog to digital converter 12 output is lower than the lower limit. These two output results are NOR'd 38 together to obtain the STATUS 36 pass/fail result. The user monitors the Pass/Fail bit 36 for each N-bit input value tested. FIG. 2 depicts a timing diagram with two complete built in self test cycles.

One feature of a circuit according to the present invention is the ability to test an analog to digital converter 12 using built in self test logic 10, and thereby eliminating the need for external analog instrumentation and test board components. With the test interface preferably compromised of only internal digital logic, a simple test pattern is all that is required to exercise the entire code matrix of the analog to digital converter 12. Programmable limits allow the user to set the fail threshold through simple pattern changes. Keeping the testing on-chip eliminates the requirement to build costly custom boards to support external analog instrumentation.

Thus, there is provided the ability to test an analog to digital converter 12 on any tester platform with minimal impact to test development cycle times. Because no external custom components are needed, a cost savings is realized. With built in self test logic 10 provided as a test wrapper around the analog to digital converter 12, the testing of analog to digital converters 12 is not limited to analog tester platforms. Enhanced yield will result at package test as this invention is implemented at wafer sort test, thereby eliminating faulty die from assembly processes.

Similarly, embodiments of this invention can be adapted to test digital to analog converters 14. To do so, the roles of the analog to digital converter 12 and the digital to analog converter 14 as described above are reversed, meaning that the device under test is the digital to analog converter 14 and the built in self test circuitry 10 includes the analog to digital converter 12.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A built in self test circuit for testing an analog to digital converter, the built in self test circuit comprising:
    an up counter adapted to receive a test input and a first clock signal and provide an upper limit,
    a down counter adapted to receive the test input and the first clock signal and provide a lower limit,
    a digital to analog converter adapted to receive the test input and a second clock signal and provide an analog output,
    circuitry for providing the analog output and a third clock signal to the analog to digital converter, the analog to digital converter thereby producing a digital signal,
    an upper limit comparator adapted to receive the upper limit and the digital signal and provide an upper limit status signal indicating whether the digital signal violates the upper limit, and
    a lower limit comparator adapted to receive the lower limit and the digital signal and provide a lower limit status signal indicating whether the digital signal violates the lower limit.

2. A built in self test circuit for testing an analog to digital converter, the built in self test circuit comprising:
    an up counter adapted to receive a test input and a first clock signal and provide an upper limit,
    a down counter adapted to receive the test input and the first clock signal and provide a lower limit,
    a digital to analog converter adapted to receive the test input and a second clock signal and provide an analog output,
    circuitry for providing the analog output and a third clock signal to the analog to digital converter, the analog to digital converter thereby producing a digital signal,
    an upper limit comparator adapted to receive the upper limit and the digital signal and provide an upper limit status signal indicating whether the digital signal violates the upper limit,
    a lower limit comparator adapted to receive the lower limit and the digital signal and provide a lower limit status signal indicating whether the digital signal violates the lower limit, and
    a nor gate adapted to receive the upper limit status signal and the lower limit status signal and provide one of a logical high as a pass indication of the analog to digital converter when the digital signal violates neither the upper limit nor the lower limit, and a logical low as a fail indication of the analog to digital converter when the digital signal violates at least one of the upper limit and the lower limit.

3. A built in self test circuit for testing a digital to analog converter, the built in self test circuit comprising:
    an up counter adapted to receive a test input and a first clock signal and provide an upper limit,
    a down counter adapted to receive the test input and the first clock signal and provide a lower limit,
    circuitry for providing the test input and a third clock signal to the digital to analog converter, the digital to analog converter thereby producing an analog signal,
    an analog to digital converter adapted to receive the analog signal and a second clock signal and provide a digital signal,
    an upper limit comparator adapted to receive the upper limit and the digital signal and provide an upper limit status signal indicating whether the digital signal violates the upper limit, and
    a lower limit comparator adapted to receive the lower limit and the digital signal and provide a lower limit status signal indicating whether the digital signal violates the lower limit.

* * * * *